United States Patent
Inayama et al.

(10) Patent No.: US 10,246,374 B2
(45) Date of Patent: Apr. 2, 2019

(54) METHOD FOR MANUFACTURING GLASS FILM LAMINATE, GLASS FILM LAMINATE, AND METHOD FOR MANUFACTURING ELECTRONIC DEVICE

(71) Applicant: NIPPON ELECTRIC GLASS CO., LTD., Otsu-shi, Shiga (JP)

(72) Inventors: Naotoshi Inayama, Otsu (JP); Mutsumu Fukada, Otsu (JP)

(73) Assignee: NIPPON ELECTRIC GLASS CO. LTD., Shiga (JP)

( * ) Notice: Subject to any disclaimer, the term of this patent is extended or adjusted under 35 U.S.C. 154(b) by 305 days.

(21) Appl. No.: 15/029,371

(22) PCT Filed: Oct. 7, 2014

(86) PCT No.: PCT/JP2014/076790
§ 371 (c)(1),
(2) Date: Apr. 14, 2016

(87) PCT Pub. No.: WO2015/056602
PCT Pub. Date: Apr. 23, 2015

(65) Prior Publication Data
US 2016/0229744 A1    Aug. 11, 2016

(30) Foreign Application Priority Data
Oct. 16, 2013    (JP) ................. 2013-215398

(51) Int. Cl.
*B32B 15/04* (2006.01)
*B32B 17/06* (2006.01)
(Continued)

(52) U.S. Cl.
CPC ........... *C03C 27/06* (2013.01); *B32B 7/06* (2013.01); *B32B 17/00* (2013.01); *B32B 17/06* (2013.01);
(Continued)

(58) Field of Classification Search
USPC .................................. 428/426, 688
See application file for complete search history.

(56) References Cited

U.S. PATENT DOCUMENTS

| 8,697,241 B2 | 4/2014 | Takaya et al. |
| 2011/0045239 A1 | 2/2011 | Takaya et al. |
| (Continued) | | |

FOREIGN PATENT DOCUMENTS

| JP | H09143767 A | 6/1997 |
| JP | H1128432 A | 2/1999 |
| (Continued) | | |

OTHER PUBLICATIONS

English Translation of the Written Opinion of the International Searching Authority corresponding to Application No. PCT/JP2014/076790; dated Jan. 13, 2015.
(Continued)

*Primary Examiner* — Lauren R Colgan
(74) *Attorney, Agent, or Firm* — Cantor Colburn LLP

(57) ABSTRACT

Provided are a glass film layered body and a method for manufacturing a glass film layered body whereby glass film yield and nondefective product rate are enhanced while handling properties of the glass film are enhanced. A method for manufacturing a glass film layered body fabricated by layering a glass film on a support glass, the method provided with an ultrasonic wave application step for applying ultrasonic waves to at least peripheral parts of the glass film and the support glass, a cleaning step for cleaning the glass film and support glass which have undergone the ultrasonic wave application step, and a layering step for layering the glass film on the support glass which has undergone the cleaning step and fabricating a glass film layered body.

21 Claims, 14 Drawing Sheets

(51) Int. Cl.
    *C03C 27/06*     (2006.01)
    *B32B 17/00*     (2006.01)
    *H01L 51/00*     (2006.01)
    *H01L 51/52*     (2006.01)
    *C03C 23/00*     (2006.01)
    *B32B 7/06*     (2019.01)

(52) U.S. Cl.
    CPC ........ *C03C 23/0075* (2013.01); *H01L 51/003* (2013.01); *H01L 51/0096* (2013.01); *H01L 51/524* (2013.01); *H01L 51/0024* (2013.01); *Y02E 10/549* (2013.01); *Y02P 70/521* (2015.11)

(56) References Cited

U.S. PATENT DOCUMENTS

2011/0048611 A1     3/2011     Carre et al.
2012/0202010 A1*   8/2012     Uchida ................... B32B 17/06
                                                                       428/157
2014/0166186 A1     6/2014     Takaya et al.

FOREIGN PATENT DOCUMENTS

| JP | 2011183792 A | 9/2011 |
| JP | 2013503366 A | 1/2013 |
| WO | 2011001946 A1 | 1/2011 |
| WO | 2011048979 A1 | 4/2011 |

OTHER PUBLICATIONS

International Search Report corresponding to Application No. PCT/JP2014/076790; dated Jan. 13, 2015, with English translation.

JPO Notification of Reasons for Refusal corresponding to JP Application No. 2014-550575; dated Jul. 17, 2018.

* cited by examiner

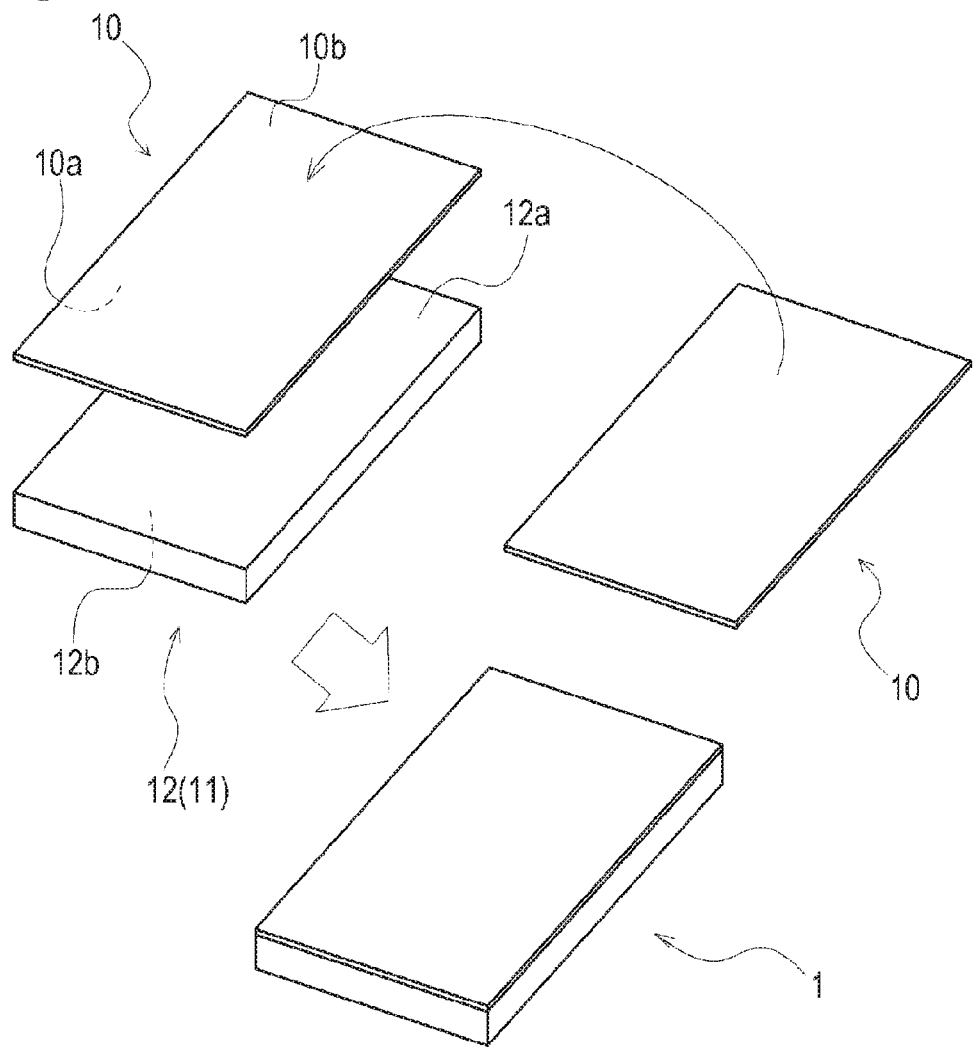

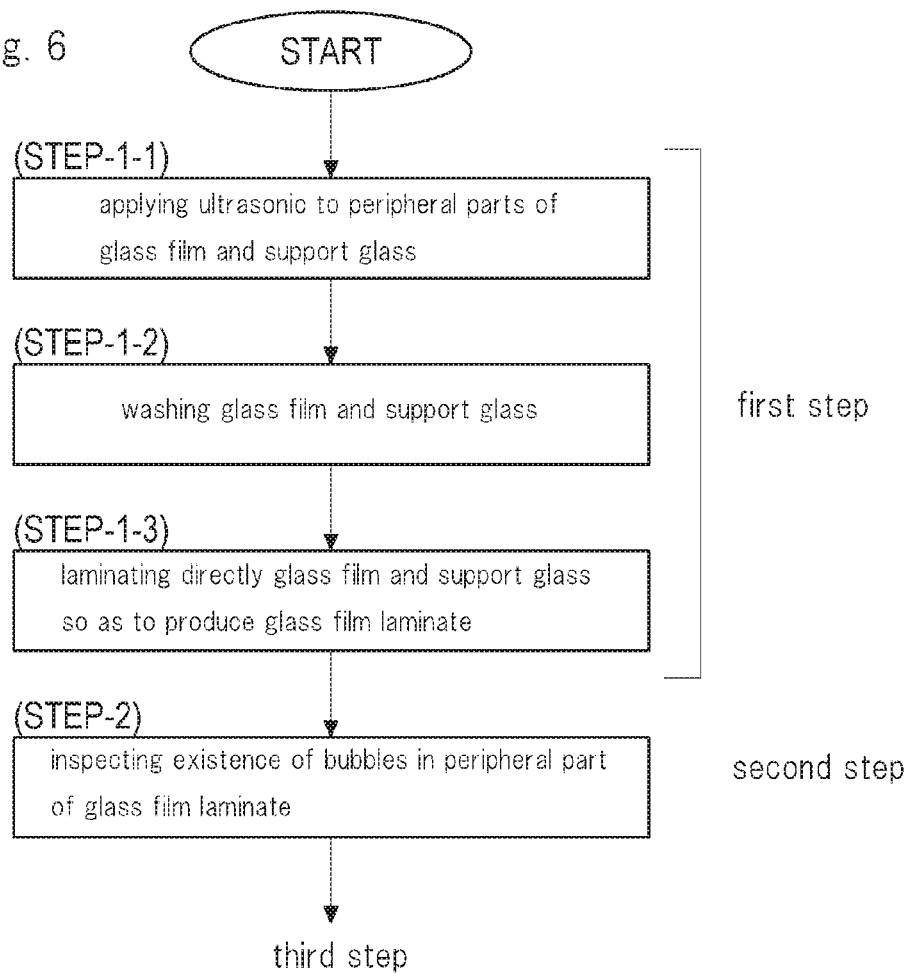

Fig. 15

| | example 1 | example 2 | example 3 | comparative example 1 |
|---|---|---|---|---|
| number of produced glass film laminates (sheets) | 100 | 100 | 100 | 100 |
| number of non-defective products by bubble inspection (sheets) | 91 | 97 | 97 | 90 |
| number of non-defective products by peripheral part inspection (sheets) | — | — | 95 | — |
| number of non-defective products of final panels (sheets) | 90 | 95 | 95 | 80 |
| non-defective rate of glass film laminates (%) | 91 | 97 | 95 | 90 |
| non-defective rate of final panels (%) | 90/91=99 | 95/97=98 | 95/95=100 | 80/90=89 |
| judgment | ○ | ○ | ◎ | × |

METHOD FOR MANUFACTURING GLASS FILM LAMINATE, GLASS FILM LAMINATE, AND METHOD FOR MANUFACTURING ELECTRONIC DEVICE

CROSS REFERENCE TO RELATED APPLICATIONS

This is the U.S. national stage of application No. PCT/JP2014/076790, filed on Oct. 7, 2014. Priority under 35 U.S.C. § 119(a) and 35 U.S.C. § 365(b) is claimed from Japanese Application No. 2013-215398, filed Oct. 16, 2013, the disclosure of which is also incorporated herein by reference.

TECHNICAL FIELD

The present invention relates to arts of a method for manufacturing a glass film laminate, a glass film laminate, and a method for manufacturing an electronic device.

BACKGROUND ART

From a point of view of space-saving, instead of a CRT type display which had spread conventionally, a flat panel display such as a liquid crystal display, a plasma display, and an organic EL display spreads in recent.

There is a need of making the flat panel display thinner.

In recent, concerning a substrate and cover glass used for devices such as the flat panel display, a need of realizing further thinning and high flexibility is increased.

For providing flexibility to a glass substrate, thinning of the glass substrate is effective, and the Patent Literature 1 proposes a glass film whose thickness is not more than 200 μm.

Manufacturing relevant processes such as a machining process and a washing process is performed concerning the glass substrate used for an electronic device such as the flat panel display and a solar cell.

However, when the glass substrate used for the electronic device is thinned, since grass is a brittle material, some change of stress causes damage, whereby there is a problem in that treatment is very difficult at the time of performing the manufacturing relevant processes of the electronic device.

In addition, since the glass film whose thickness is not more than 200 μm has high flexibility, positioning at the time of performing the process is difficult and there is a problem in that a gap or the like occurs at the time of patterning.

For improving handling of the thinned glass film, the Patent Literature 1 proposes a glass film laminate in which the glass film is laminated on support glass.

According to the glass film laminate, even when the glass film which lacks intensity and rigidity alone is used, since rigidity of the support glass is high, positioning of the whole glass film laminate at the time of performing the process is easy.

After finishing the process, the glass film can be exfoliated from the support glass.

When a thickness of the glass film laminate is the same as a thickness of the conventional glass substrate, an electronic device can be manufactured with an electronic device manufacturing line for the conventional glass substrate.

PRIOR ART REFERENCE

Patent Literature

Patent Literature 1: the Japanese Patent Laid Open Gazette 2011-183792

DISCLOSURE OF INVENTION

Problems to be Solved by the Invention

In the case of manufacturing the electronic device such as a liquid crystal panel with the glass film laminate shown in the Patent Literature 1, generally, a step in which resist liquid is applied to the glass film laminate (resist step) is provided. The resist liquid applied to the glass film laminate in the resist step is solidified by a method such as photosensitizing, heating or drying.

In the conventional glass film laminate 1 shown in the Patent Literature 1, as shown in FIG. 16, bubbles 14 may be formed in an interface 13 of the glass film 10 and a support glass 12 which is the support body 11. The bubbles 14 include a bubble communicated with atmosphere at an outer peripheral edge of the glass film 10. Hereinafter, such the bubble 14 is referred to as an open bubble 14a.

In the glass film laminate 1 in which the open bubble 14a exists in the interface 13, there is a problem in that the resist liquid applied in the resist step enters the open bubble 14a.

Since the resist liquid entering the open bubble 14a is then solidified, there is a problem in that the glass film 10 and the support glass 12 in a part in which the open bubble 14a exists are made adhere each other by the solidified resist liquid.

Furthermore, in the glass film laminate 1 adhered by the resist liquid, at the time of separating the support glass 12 and the glass film 10, there is a problem in that the adhered part is hard to be exfoliated so as to cause damage of the glass film 10, whereby a yield of the glass film 10 is worsened and a non-defective rate of the glass film 10 obtained from the glass film laminate 1 is worsened.

Accordingly, it is desired that occurrence of damage at the time of exfoliating the glass film is suppressed by preventing the adhesion of the support glass and the glass film by the resist liquid so as to improve the yield and the non-defective rate of the glass film.

The present invention is provided in consideration of the conditions as mentioned above, and the purpose of the invention is to provide a glass film laminate a method for manufacturing the glass film laminate in which generation of an open bubble in a laminating interface of the glass film laminate is prevented while improving handling of a glass film so as to improve a yield and a non-defective rate of the glass film.

Means for Solving the Problems

The problems to be solved by the present invention have been described above, and subsequently, the means of solving the problems will be described below.

The first invention of the application is a method for manufacturing a glass film laminate produced by laminating a glass film on a support body including an ultrasonic wave application step in which an ultrasonic wave is applied to at least peripheral parts of the glass film and the support body, a washing step in which the glass film and the support body passing through the ultrasonic wave application step are washed, and a laminating step in which the glass film and the support body passing through the washing step are laminated so as to produce the glass film laminate.

According to the second invention of the application, the support body is support glass.

According to the third invention of the application, in the ultrasonic wave application step, the ultrasonic wave is applied by a horn-type ultrasonic wave generator.

According to the fourth invention of the application, in the ultrasonic wave application step, the ultrasonic wave is applied to only the peripheral parts of the glass film and the support glass.

According to the fifth invention of the application, in an ultrasonic wave washing step, the glass film and the support body are dipped in liquid in an ultrasonic wave washing tub and the whole of the glass film and the support glass are ultrasonic-washed by the ultrasonic wave washing tub.

The sixth invention of the application further includes an open bubble inspection step inspecting existence of an open bubble which is a bubble existing in an interface of the glass film and the support body and contacting an edge side of the glass film.

According to the seventh invention of the application, in the open bubble inspection step, existence of a bubble except for the open bubble in a peripheral part of the glass film laminate corresponding to the peripheral part of the glass film is inspected further.

According to the eighth invention of the application, the peripheral part of the glass film laminate is within a width of not less than 10 mm from the edge side of the glass film.

According to the ninth invention of the application, a number of bubbles in the glass film laminate except for the peripheral part is not less than $0.1/m^2$ and not more than $10000/m^2$.

The tenth invention of the application is a glass film laminate produced by laminating directly a glass film and support glass, wherein all the edge sides of the glass film contact tightly the support glass.

According to the eleventh invention of the application, the glass film contacts tightly the support glass with a width not less than 10 mm from all the edge sides of the glass film.

According to the twelfth invention of the application, a number of bubbles in a part of the glass film laminate except for the part in which the glass film contacts tightly the support glass is not less than $0.1/m^2$ and not more than $10000/m^2$.

According to the thirteenth invention of the application, a thin film layer is provided in the support glass.

The fourteenth invention of the application is a method for manufacturing an electronic device including a laminating step in which a glass film is laminated on a support body so as to produce the glass film laminate before a manufacturing relevant process of the electronic device, a step in which the manufacturing relevant process of the electronic device is performed to the glass film of the glass film laminate so as to form an element on the glass film of the glass film laminate and the element is closed by a closing substrate, thereby producing the electronic device with the support body, and a step in which the glass film of the electronic device with the support body after the manufacturing relevant process of the electronic device is exfoliated from the support body so as to manufacture the electronic device. In the laminating step, the glass film laminate is produced by the method for manufacturing the glass film laminate according to one of claims 1 to 8.

Effect of the Invention

The present invention brings the following effects.

According to the first invention of the application, generation of the open bubble in the peripheral part of the glass film laminate can be prevented.

Accordingly, penetration of the resist liquid to the interface of the glass film and the support body in the resist step can be prevented, and as a result, adhesion of the glass film and the support body can be prevented, thereby preventing damage of the glass film at the time of exfoliation.

According to the second invention of the application, at the time of using the support grass as the support body, generation of the open bubble in the peripheral part of the glass film laminate can be prevented.

According to the third invention of the application, foreign matters causing the normal open bubble can be removed certainly from the peripheral part of the glass film and the support body.

According to the fourth invention of the application, time required for removing the foreign matters causing the normal open bubble can be shortened.

According to the fifth invention of the application, the foreign matters causing the open bubble can be removed certainly from the peripheral parts of the glass film and the support body.

By removing foreign matters in parts of the glass film and the support body except for the peripheral parts, a non-defective rate of the glass film can be improved.

According to the sixth invention of the application, the glass film laminate in which the open bubble exists can be eliminated.

Accordingly, a yield of the glass film after a manufacturing relevant process can be improved.

According to the seventh invention of the application, generation of the open bubble after inspecting existence of the open bubble can be prevented.

Accordingly, the yield of the glass film after a manufacturing relevant process can be improved certainly.

According to the eighth invention of the application, generation of the open bubble in the peripheral part of the glass film laminate can be prevented certainly.

According to the ninth invention of the application, generation of the close bubble at an inner side from the peripheral part of the glass film laminate can be prevented certainly while suppressing time and cost.

According to the tenth invention of the application, penetration of the resist liquid to the interface of the glass film and the support body in the resist step can be prevented, and as a result, adhesion of the glass film and the support body can be prevented, thereby preventing damage of the glass film at the time of exfoliation.

According to the eleventh invention of the application, the yield of the glass film can be improved.

According to the twelfth invention of the application, generation of the close bubble at an inner side from the peripheral part of the glass film laminate can be prevented certainly while suppressing time and cost.

According to the thirteenth invention of the application, the glass film can be exfoliated easily, whereby the yield of the glass film can be improved.

According to the fourteenth invention of the application, a yield of the electronic device can be improved.

BRIEF DESCRIPTION OF DRAWINGS

FIG. 3 is a schematic perspective view of producing status of the glass film laminate.

FIG. 4A is a drawing of status of hydrogen bond of hydroxyl groups, and FIG. 4B is a drawing of status of hydrogen bond in which a water molecule is interposed.

FIG. 6 is a flow chart of the method for manufacturing the glass film laminate according to the present invention.

FIG. 7 is a schematic drawing of components of the glass film laminate according to the present invention.

FIG. 8A is a schematic plan view, and FIG. 8B is a schematic side view.

FIG. 15 is a diagram of results of an experiment confirming improvement status of a non-defective rate in the glass film laminate according to the present invention.

DETAILED DESCRIPTION OF THE INVENTION

A suitable embodiment of a glass film laminate according to the present invention is explained referring to drawings.

Firstly, a method for manufacturing a glass film laminate 1 according to the present invention is explained.

Figure 1:
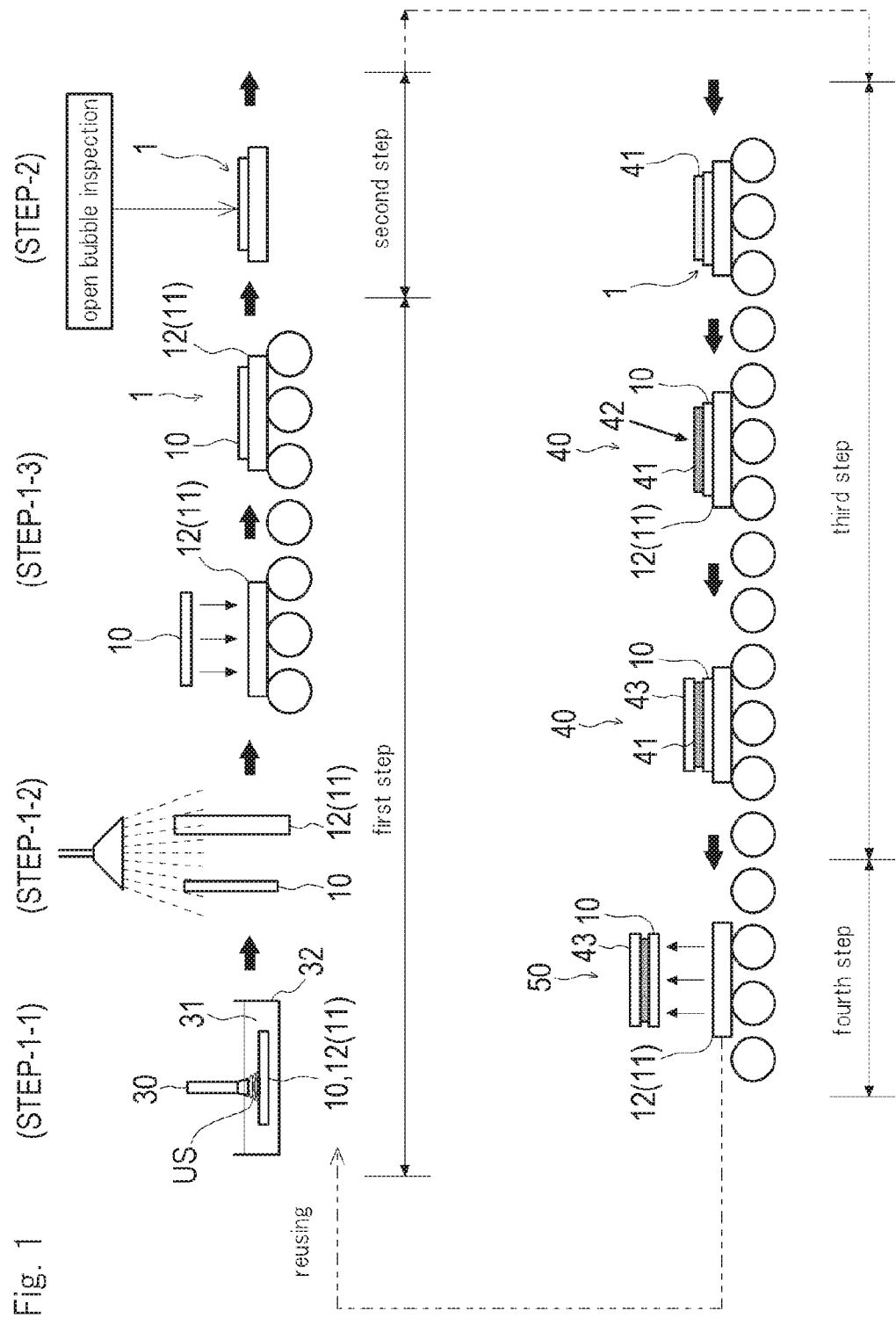
FIG. 1 is a schematic drawing of a method for manufacturing an electronic device (glass film) which includes a method for manufacturing a glass film laminate according to the present invention.

In the method for manufacturing the glass film laminate 1 according to the present invention, as shown in FIG. 1, in a first step, a glass film 10 is laminated on a support body 11 so as to produce the glass film laminate 1.

Silicate glass and silica glass, preferably borosilicate, the most preferably non-alkali glass are used for the glass film 10.

When the glass film 10 includes alkali components, positive ions fall off from a surface of the film and so-called sodium blowing phenomenon occurs, whereby the structure becomes rough. In this case, when the glass film 10 is used while being bent, the part which becomes rough by deterioration with time may be broken.

Herein, the non-alkali glass is glass which does not include alkali components (alkali metal oxides) substantially, and is concretely glass whose alkali components are not more than 3000 ppm.

A content of the alkali components of the non-alkali glass used for the present invention is preferably not more than 1000 ppm, more preferably not more than 500 ppm, further more preferably not more than 300 ppm.

A thickness of the glass film 10 is preferably not more than 300 μm, more preferably 5 to 200 μm, and the most preferably 5 to 100 μm.

Accordingly, the glass film 10 can be made thinner so as to obtain suitably flexibility.

The thinner glass film 10 is difficult to be handled and problems such as miss of positioning and bending at the time of patterning tend to occur. However, by using the support body 11 discussed later, manufacturing relevant processes such as patterning can be performed easily.

When the thickness of the glass film 10 is less than 5 μm, strength of the glass film 10 is needy and the glass film 10 may be hard to be exfoliated from the support body 11.

A material of the support body 11 is not limited if it can support the glass film 10, and a platy body such as a synthetic resin plate, a natural resin plate, a wood plate, a metal plate, a grass plate, a ceramic plate, a crystallized glass plate and the like can be used. A thickness of the support body 11 is not limited and may be selected suitably corresponding to rigidity of a material selected as the support body. For improving the handling of the glass film 10, a resin film such as a PET film may be used. The support body 11 may be configured by providing suitably a resin layer discussed later on a surface of the platy body so as to control property of adhering to and exfoliating from the glass film 10.

Preferably, a support glass 12 is used for the support body 11. Accordingly, characteristics and shapes of the glass film 10 and the support glass 12 are stable concerning heat treatment, chemical liquid treatment, exposure treatment and the like in the manufacturing relevant processes of an electronic device, whereby stable laminated state of the glass film laminate 1 can be maintained.

Similarly to the glass film 10, silicate glass and silica glass, borosilicate or non-alkali glass is used for the support glass 12.

As the support glass 12, preferably, glass that a difference of thermal expansion coefficients with the glass film 10 at 30 to 380° C. is within $5 \times 10^{-7}/°$ C. is used.

For suppressing the difference thermal expansion rates, the most preferably, glass of the same composition is used for both the glass film 10 and the support glass 12.

A thickness of the support glass 12 is preferably not less than 400 μm. When the thickness of the support glass 12 is less than 400 μm, problems may be caused by strength when the support glass 12 is dealt with alone. The thickness of the support glass 12 is preferably 400 to 700 μm, and the most preferably 500 to 700 μm.

Accordingly, the glass film 10 can be supported certainly by the support glass 12, and breakage of the glass film 10 occurring at the time of exfoliating the glass film 10 from the support glass 12 can be suppressed efficiently.

At the time of applying resist liquid discussed later (third step), when the glass film laminate 1 is mounted on a setter (not shown), the thickness of the support glass 12 may be less than 400 μm (the same thickness as the glass film 10, for example 300 μm).

The glass film 10 and the support glass 12 used for the present invention are made preferably by a down draw method, and more preferably by an overflow down draw method.

Figure 2:
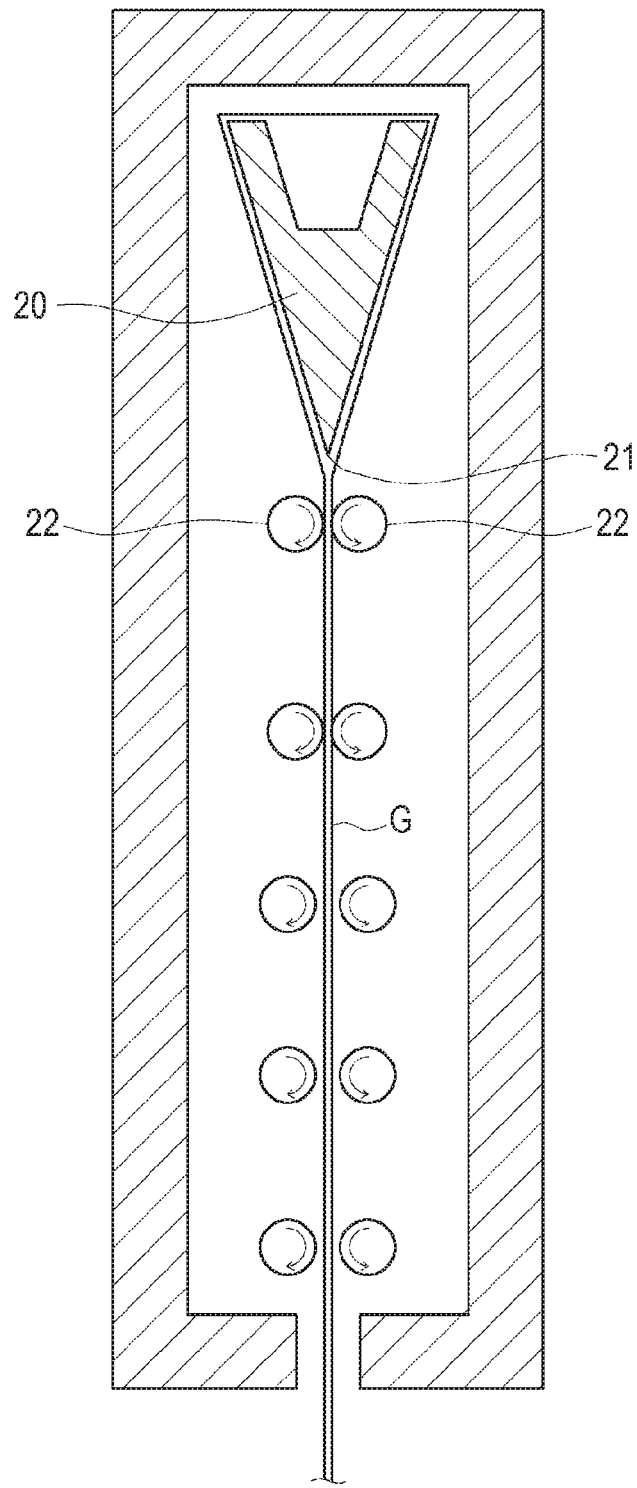
FIG. 2 is a schematic drawing of a method for producing the glass film (overflow down draw method).

Especially, the overflow down draw method shown in FIG. 2 is a forming method in which both surfaces of a glass plate do not contact forming members and the both surfaces (translucent surface) of the obtained glass plate is hardly damaged, whereby high surface quality without polish. Of course, the glass film 10 and the support glass 12 used for the present invention may be formed by a float method, a slot downdraw method, a roll out method, an updraw method, redraw method or the like.

In the overflow down draw method shown in FIG. 2, a grass ribbon G just after flowing down from a lower end 21 of a molding body 20 whose sectional shape is wedge-like is extended downward while expansion and contraction in a width direction of the grass ribbon G is restricted by cooling rollers 22 so as to be made thin to a predetermined thickness. Next, the grass ribbon G with the predetermined thickness is cooled gradually by a slow cooling furnace (annealer) so as to remove heat distortion of the grass ribbon G, and the grass ribbon G is cut into a predetermined size, whereby the glass film 10 and the support glass 12 are formed respectively.

An embodiment in which the support glass 12 is adopted as the support body 11 is explained. In the parts except for characteristic explanations resulting from a material of the support glass 12, the support glass 12 can be suitably read as the support body 11.

As shown in FIG. 3, a contact surface 10a and an effective surface 10b are set in the glass film 10.

The contact surface 10a faces and contacts the support glass 12 at the time of being laminated with the support glass 12.

The effective surface 10b is opposite to the contact surface 10a and the manufacturing relevant processes such as forming of elements are performed therein.

A contact surface 12a and a conveyance surface 12b are set in the support glass 12.

The contact surface 12a faces and contacts the glass film 10 at the time of being laminated with the glass film 10.

The conveyance surface 12b is opposite to the contact surface 12a and contacts conveyance rollers when the glass film laminate 1 is conveyed on the conveyance rollers.

Though the glass film 10 having substantially the same area as the support glass 12 is laminated on the support glass 12 in FIG. 3, the support glass 12 may overflow the glass film 10.

In this case, an overflow amount of the support glass 12 from the glass film 10 is preferably 0.5 to 10 mm, and more preferably 0.5 to 1 mm.

By making the overflow amount of the support glass 12 small, an area of the effective surface 10b of the glass film 10 can be secured more widely.

The step laminating the glass film 10 on the support glass 12 may be performed under decompression. Accordingly, bubbles generated between the glass film 10 and the support glass 12 when the glass film 10 and the support glass 12 are laminated can be reduced.

A surface roughness Ra of each of the contact surface 10a of the glass film 10 and the contact surface 12a of the support glass 12 is preferably not more than 2.0 nm. Accordingly, the glass film contacts the support glass with smooth surfaces so as to improve the adhesion, whereby the glass film and the support glass can be laminated firmly stably without any bonding agent.

For laminating firmly stably the glass film 10 and the support glass 12 without any bonding agent, the surface roughness Ra of each of the contact surfaces 10a and 12a of the glass film 10 and the support glass 12 used in the present invention is preferably not more than 1.0 nm, more preferably not more than 0.5 nm, and the most preferably not more than 0.2 nm.

In this embodiment, the surface roughness Ra of each of the surfaces of the glass film 10 and the support glass 12 contacting each other is not more than 2.0 nm, and in the first step, the glass film 10 and the support glass 12 each of whose surfaces contacting each other is not more than 2.0 nm are laminated and the glass film 10 is fixed firmly to the support glass 12, whereby the glass film laminate 1 is produced.

By smoothing the contact surfaces 10a and 12a of the glass film 10 and the support glass 12 so as to make the surface roughness Ra thereof not more than 2.0 nm, when the two smooth glass plates contact tightly each other, the glass plates are made adhere detachably without any bonding agent, whereby the glass film laminate 1 is configured. It is guessed that this phenomenon is based on following mechanism.

Figure 4A:
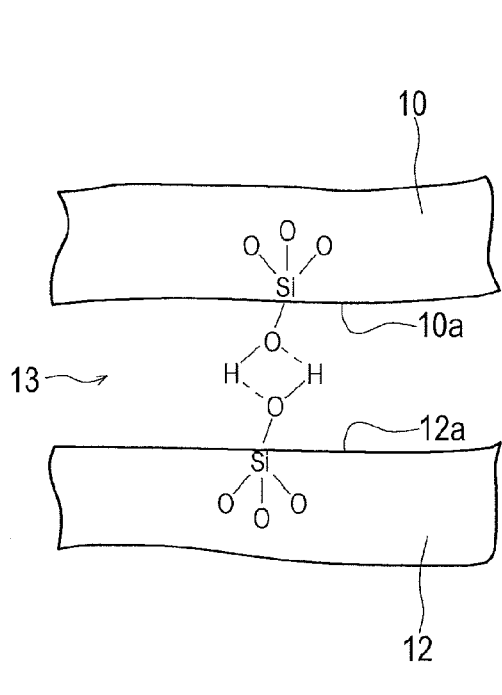
FIGS. 4A-B are schematic drawings of a bonding mechanism of the glass film and a support glass.
Figure 4B:
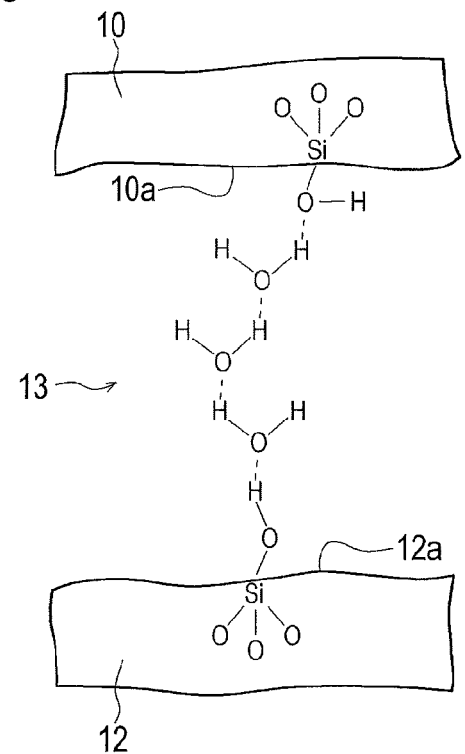

As shown in FIG. 4A, it is thought that the surface of the glass film 10 (the contact surface 10a) and the surface of the support glass 12 (the contact surface 12a) are attracted to each other by hydrogen bond of hydroxyl groups formed thereon. Otherwise, as shown in FIG. 4B, it is thought that the glass film 10 and the support glass 12 are made adhere each other by forming hydrogen bond of water molecules existing in an interface 13 of the glass film 10 and the support glass 12.

Figure 5:
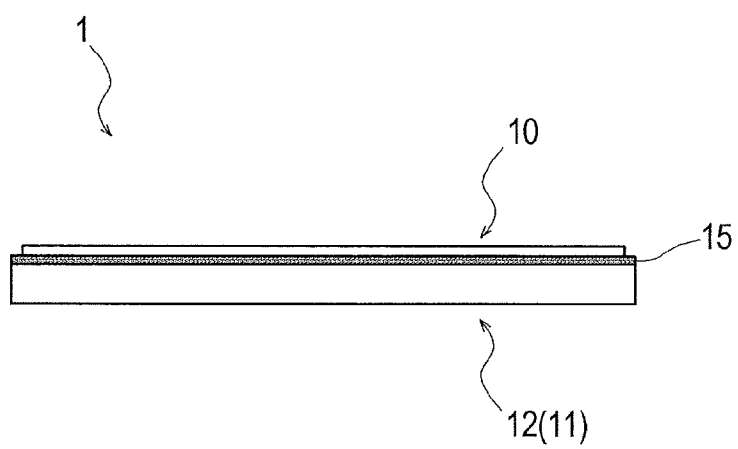
FIG. 5 is a schematic drawing of another embodiment of the glass film laminate according to the present invention.

Though the glass film 10 is laminated directly on the support glass 12 in this embodiment, it may be configured that a thin film layer 15 is formed on the support glass 12 and then the glass film 10 is laminated as shown in FIG. 5. Preferably, inorganic oxide such as ITO and $ZrO_2$, nitride such as $SiN_x$, TiN, CrN, TiAlN and AlCrN, metal such as Ti, carbide such as diamond-like carbon, TiC and WC, or fluoride such as $MgF_2$ is used for the thin film layer 15. In this case, a surface roughness Ra of the thin film layer 15 is preferably not more than 2.0 nm, not more than 1.0 nm, not more than 0.5 nm or not more than 0.2 nm in this order. Resin may be used for the thin film layer 15, and in this case, since the glass film 10 is exfoliated finally, a slightly adhesive film is preferably used as the thin film layer 15 formed on the support glass 12. In this case, polyethylene, polyvinyl chloride, polyethylene terephthalate, polyvinylidene chloride, polypropylene, poly vinyl alcohol, polyester, polycarbonate, polystyrene, polyacrylonitrile, ethylene-vinyl acetate copolymer, ethylene-vinyl alcohol copolymer, ethylene-methacrylic acid copolymer, nylon, cellophane, silicone resin and the like can be used. As the thin film layer 15, only a base material may be used when the material is adhesive, a base material whose surfaces are applied thereto with a bonding agent, or an adhesive layer without any base material may be used.

On the other hand, a surface roughness of the effective surface 10b of the glass film 10 is not limited especially. However, since a forming step of elements and the like are performed in a third step discussed later, the surface roughness Ra of the effective surface 10b is preferably not more than 2.0 nm, more preferably not more than 1.0 nm, further more preferably not more than 0.5 nm, and the most preferably not more than 0.2 nm. A surface roughness of the conveyance surface 12b of the support glass 12 is not limited especially.

As shown in FIGS. 1 and 6, the method for manufacturing the glass film laminate 1 according to the present invention is characterized in that, in the first step, before a laminating step (STEP-1-3) in which the glass film 10 and the support glass 12 are laminated directly so as to produce the glass film laminate 1, an ultrasonic wave application step (STEP-1-1) in which an ultrasonic wave US is applied to the glass film 10 and the support glass 12 and a washing step (STEP-1-2) in which foreign matters adhering the glass film 10 and the support glass 12 after the ultrasonic wave application step (STEP-1-1) are washed and removed are provided.

The ultrasonic wave application step (STEP-1-1) and the washing step (STEP-1-2) prevent generation of an open bubble in the interface 13 of the glass film laminate 1.

Figure 16:
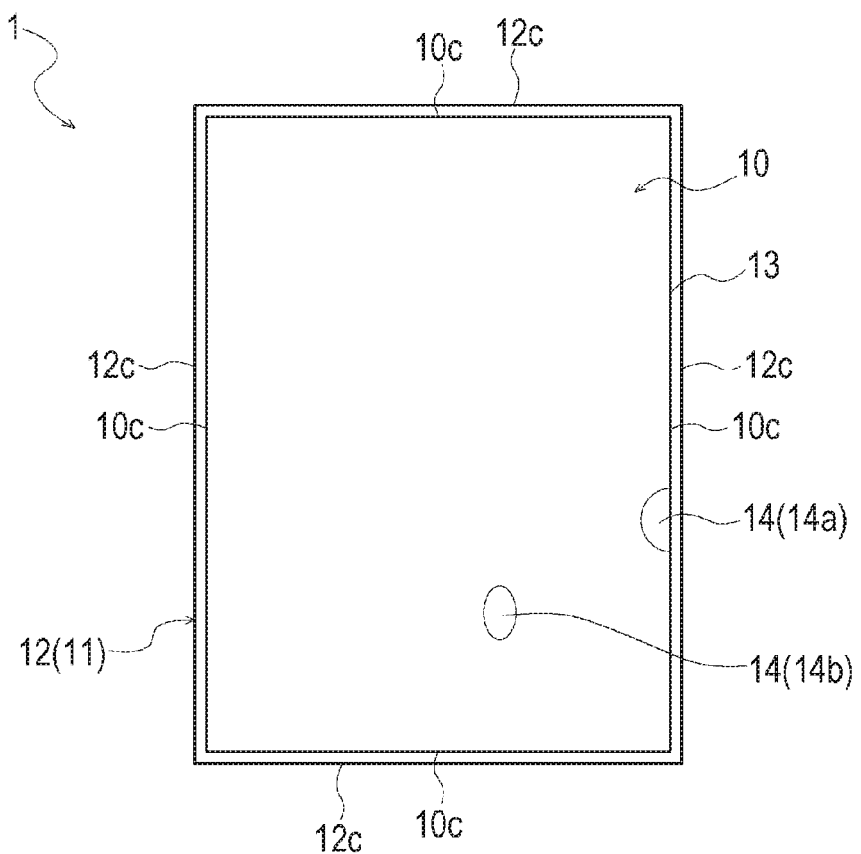
FIG. 16 is a schematic plan view of a conventional glass film laminate in which an open bubble exists.

As shown in FIG. 16, when foreign matters exist in the interface 13 at the time of laminating the glass film 10 and the support glass 12, the glass film 10 and the support glass 12 are not adhered partially by the foreign matters, whereby bubbles 14 may be formed in the interface 13 of the glass film laminate 1.

Namely, by removing certainly the foreign matters on the contact surface 10a of the glass film 10 and the contact surface 12a of the support glass 12, generation of the bubbles 14 in the interface 13 can be prevented.

As shown in FIG. 16, among the bubbles 14, an open bubble 14a which is the bubble 14 contacting an edge side 10c of the glass film 10 and a close bubble 14b which is the bubble 14 not contacting the edge side 10c of the glass film 10 exist.

Among the bubbles 14 existing in the interface 13 of the glass film 10 and the support glass 12, the open bubble 14a contacts the edge side 10c of the glass film 10 and is communicated with the outside. The close bubble 14b does not contact the edge side 10c of the glass film 10 and is not communicated with the outside.

Figure 7A:
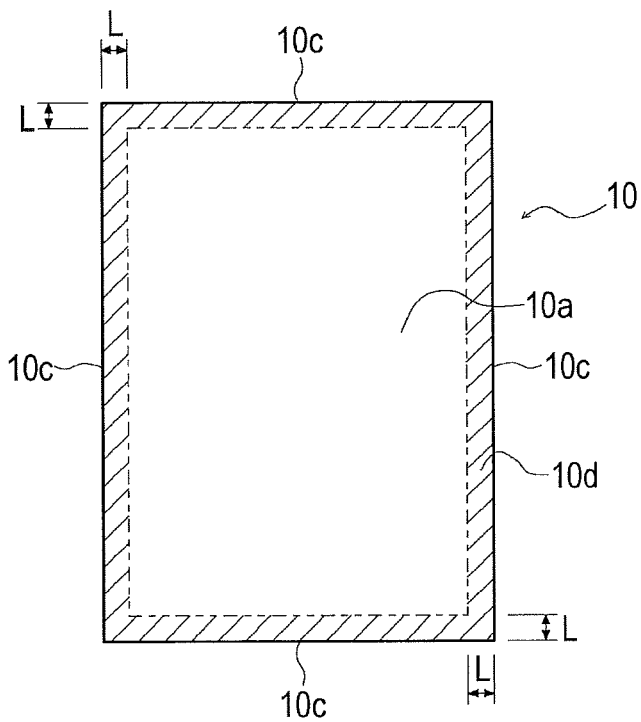
FIG. 7A is a schematic plan view of the glass film.
Figure 7B:
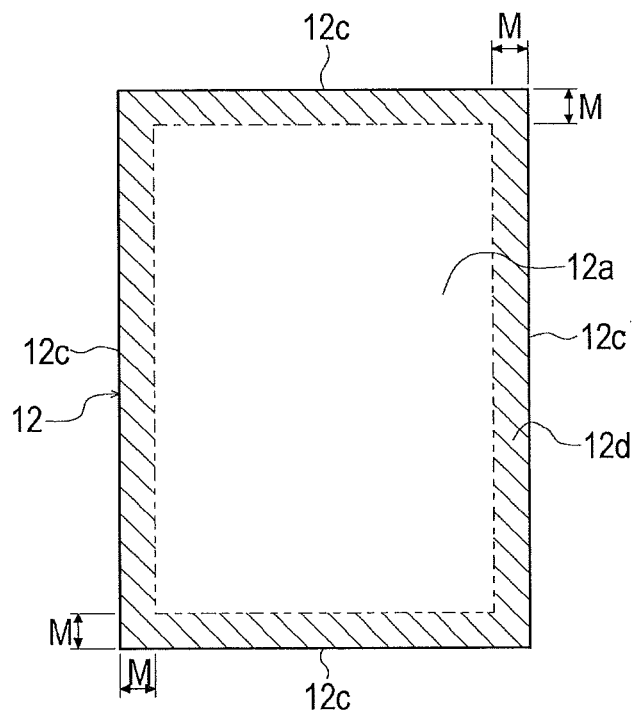
FIG. 7B is a schematic plan view of the support glass.

In the method for manufacturing the glass film laminate 1 according to the present invention, as shown in FIGS. 7A and 7B, remove of the foreign matters in the ultrasonic wave application step (STEP-1-1) and the washing step (STEP-1-2) is performed concerning at least the peripheral parts 10d and 12d of the glass film 10 and the support glass 12.

As shown in FIG. 7A, the peripheral part 10d of the glass film 10 is a range within a predetermined width L from the four edge sides 10c in the contact surface 10a of the glass film 10 (a range to which lines upward slanting to the right are applied), and as shown in FIG. 7B, the peripheral part 12d of the support glass 12 is a range within a predetermined width M from four edge sides 12c in the contact surface 12a of the support glass 12 (a range to which lines upward slanting to the left are applied).

Figure 8A:
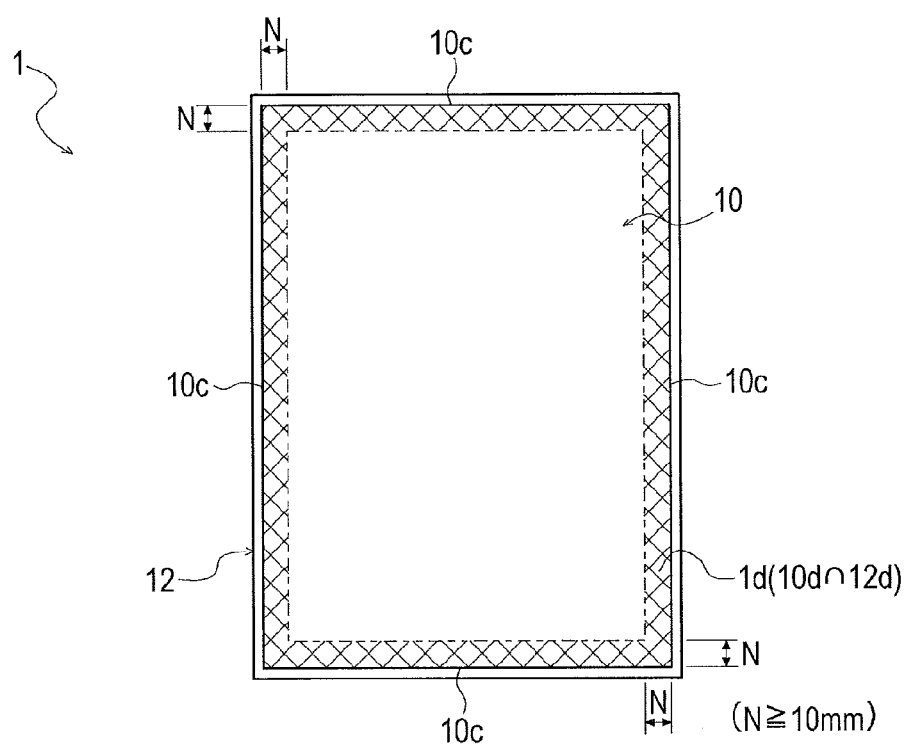
FIGS. 8A-B are schematic drawings of the glass film laminate according to the present invention.

As shown in FIG. 8A, an overlapping range of the peripheral parts 10d and 12d (a range of a predetermined width N to which slanting lines are applied shading-like) is specified as a peripheral part 1d of the glass film laminate 1.

The peripheral part 10d of the glass film 10 does not need to be completely in agreement with the peripheral part 12d of the support glass 12. The peripheral part 10d of the glass film 10 may overflow the peripheral part 12d of the support glass 12, and on the contrary, the peripheral part 12d of the support glass 12 may overflow the peripheral part 10d of the glass film 10.

There is an especially high possibility that the foreign matters existing in the peripheral part 1d become a factor of the open bubble 14a. There is a high possibility that the close bubble 14b owing to the foreign matters existing in the peripheral parts 10d and 12d changes to the open bubble 14a by shifting its position by stress from the outside or change with time.

Namely, for preventing the open bubble 14a certainly, forming of the close bubble 14b in the peripheral part 1d must be prevented.

Figure 8B:
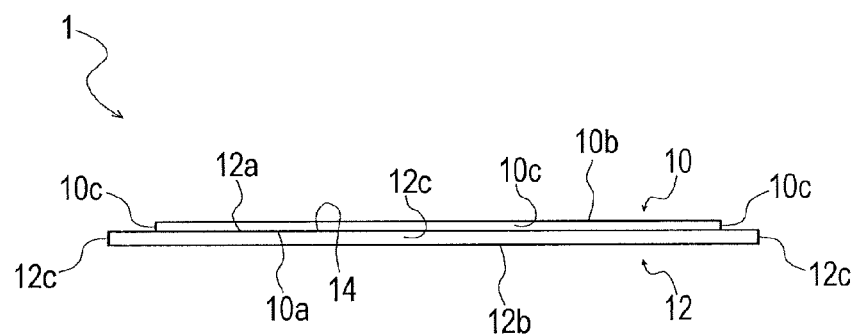

Accordingly, in the method for manufacturing the glass film laminate 1 according to the present invention, the foreign matters in the peripheral parts 10d and 12d are certainly removed by the ultrasonic wave application step (STEP-1-1) and the washing step (STEP-1-2), whereby no foreign matter exists in the peripheral part 1d. The glass film laminate 1 according to the present invention is produced so that the open bubble 14a does not exist in the peripheral part 1d, and as shown in FIG. 8B, the edge sides 10c of the glass film 10 contact closely to the contact surface 12a of the support glass 12.

A number of the close bubbles 14b except for the peripheral part 10d is preferably small.

Concretely, the number of the close bubbles 14b whose diameter converted to a circle is not less than 5 mm is preferably not more than 10000/m², more preferably not more than 1000/m², further more preferably not more than 100/m², and the most preferably not more than 10/m².

That is because since smoothness is required at the time of performing the manufacturing relevant processes of the element (electronic device), the number of the close bubble 14b except for the peripheral part 10d is preferably small.

The number of the close bubbles 14b except for the peripheral part 10d is preferably not less than 0.1/m².

That is because time for washing and the like is required for lessening the number of the close bubbles 14b except for the peripheral part 10d as much as possible and cost for producing the glass film laminate may be increased. The number of the close bubbles 14b except for the peripheral part 10d is preferably not less than 0.5/m², more preferably not less than 1/m², further more preferably not less than 2/m².

The predetermined width N of the peripheral part 1d of the glass film laminate 1 according to this embodiment is 10 mm, and the predetermined width N of the glass film laminate according to the present invention is preferably not less than 10 mm.

That is because there is an especially high possibility that the bubble 14 generated at a position whose distance from the edge side 10c of the glass film 10 is less than 10 mm becomes the open bubble 14a, and there is a possibility that the close bubble 14b generated in this range changes to the open bubble 14a by shifting its position by stress from the outside or change with time.

Furthermore, that is because the foreign matters existing 10 mm or more inner side from the edge side 10c is hardly become the factor of the open bubble 14a.

The range to which the ultrasonic wave US is applied in the ultrasonic wave application step (STEP-1-1) may include a part at an inner side from the peripheral parts 10d and 12d (the range of the predetermined widths L and M shown in FIGS. 7A and 7B), or the ultrasonic wave US may be applied to a whole surface (whole range) of the glass film 10 and the support glass 12.

That is because by removing the foreign matters existing at the inner side from the peripheral parts 10d and 12d, a non-defective rate of the glass film 10 can be improved.

Figure 9:
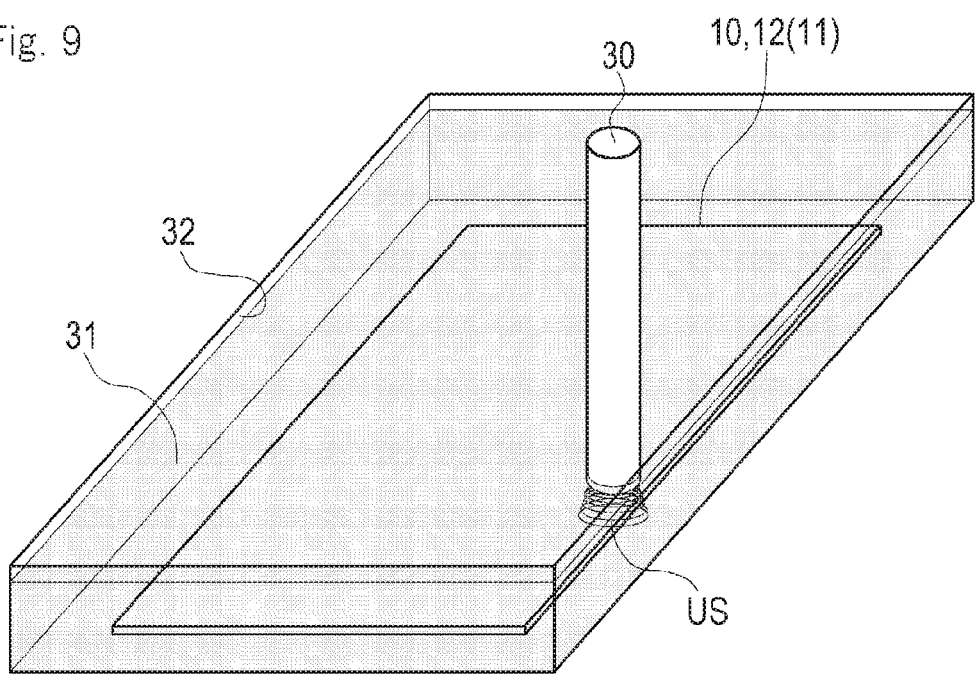
FIG. 9 is a schematic perspective view of application status of an ultrasonic wave by a horn-type ultrasonic wave generator in the method for manufacturing the glass film laminate according to the present invention.

As shown in FIG. 9, in the method for manufacturing the glass film laminate 1 according to the present invention, a horn-type ultrasonic wave generator 30 is used as a means applying the ultrasonic wave US to the glass film 10 and the support glass 12.

In comparison with a tub-type ultrasonic wave generator, the horn-type ultrasonic wave generator 30 can apply partially the stronger ultrasonic wave US, thereby being suitable for removing foreign matters adhering the surfaces of the glass film 10 and the support glass 12. Especially, by using the horn-type ultrasonic wave generator 30, grass powder adhering to the surfaces which cannot be removed by normal scrubbing can be removed.

Since an operator can select and scan a position to which the ultrasonic wave US is applied simultaneously by the horn-type ultrasonic wave generator 30, a part of the glass film 10 and the support glass 12 in which the foreign matters become the factor of the open bubble 14*a* (that is, the range of the predetermined widths L and M) can be selected preferentially and the ultrasonic wave US can be applied thereto.

According to the configuration in which the ultrasonic wave US is applied to only the range of the predetermined widths L and M by the horn-type ultrasonic wave generator 30, time required for a work applying the ultrasonic wave US can be shortened, whereby generation of the open bubble 14*a* can be prevented efficiently.

In the method for manufacturing the glass film laminate 1 according to the present invention, when the ultrasonic wave US is applied to the glass film 10 and the support glass 12 in the ultrasonic wave application step (STEP-1-1), the glass film 10 and the support glass 12 are arranged in a tub 32 filled with liquid 31 and the ultrasonic wave US is applied to the glass film 10 and the support glass 12 while being dipped in the liquid 31.

In this embodiment, pure water is used as the liquid 31 in which the glass film 10 and the support glass 12 are dipped. Liquid except for the pure water such as ethanol may be used as the liquid 31 in which the glass film 10 and the support glass 12 are dipped.

In the method for manufacturing the glass film laminate 1 according to the present invention, it may be configured that an ultrasonic wave washing tub is used as the tub 32 and an ultrasonic wave washing process is provided further. Namely, the ultrasonic wave may be applied to the whole of the glass film 10 and the support glass 12 by the tub (ultrasonic wave washing tub) 32 before, after or midst applying the ultrasonic wave US to the glass film 10 and the support glass 12 by the horn-type ultrasonic wave generator 30.

According to the configuration in which the ultrasonic wave is applied to the range of the predetermined widths L and M by the horn-type ultrasonic wave generator 30 while the ultrasonic wave is applied to the whole of the glass film 10 and the support glass 12, the foreign matters adhering the whole range of the whole of the glass film 10 and the support glass 12 can be removed in addition to preventing generation of the open bubble 14*a* in the peripheral part 1*d*, whereby the non-defective rate of the glass film 10 can be improved.

As shown in FIGS. 1 and 6, the method for manufacturing the glass film laminate 1 according to the present invention includes an open bubble inspection step (STEP-2) which is a second step in which whether the open bubble 14*a* exists in the peripheral part 1*d* of the glass film laminate 1 or not after producing the glass film laminate 1.

Figure 10:
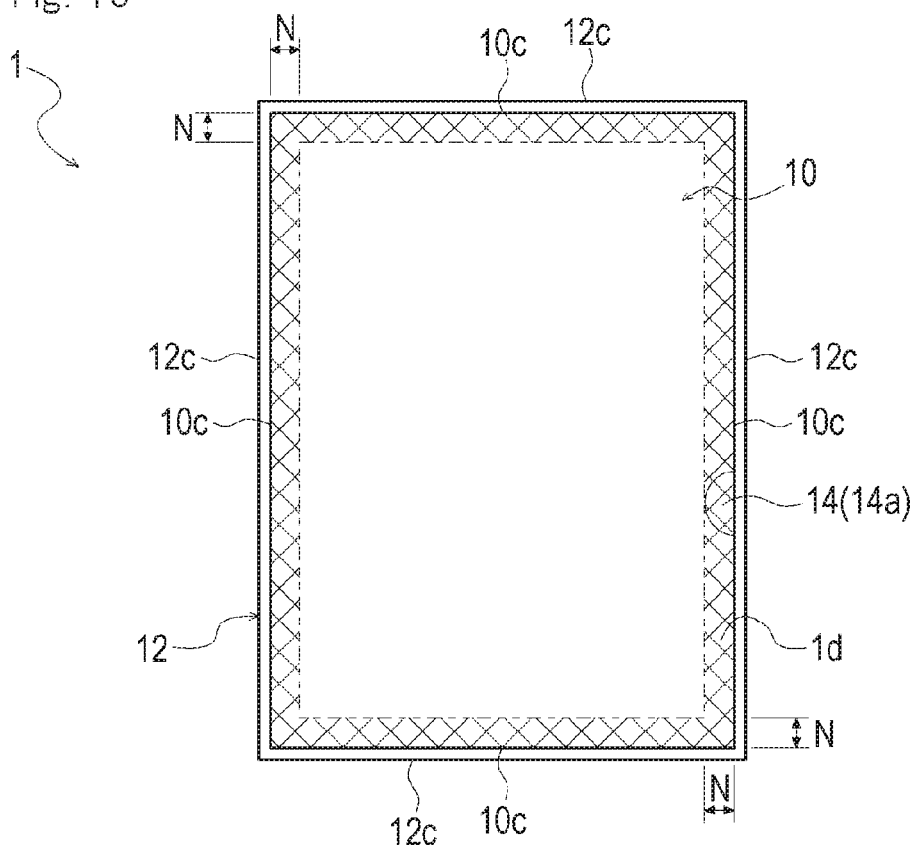
FIG. 10 is a schematic plan view of the glass film laminate (in the state in which an open bubble exists in a peripheral part).

In the open bubble inspection step (STEP-2), the glass film laminate 1 in which the open bubble 14*a* exists in the peripheral part 1*d* as shown in FIG. 10 is eliminated as a defective product.

As the open bubble inspection step (STEP-2), in addition to visual inspection, optical inspection using suitably an edge light, a microscope, a line camera or the like can be used.

Namely, the method for manufacturing the glass film laminate 1 according to the present invention includes further the open bubble inspection step (STEP-2) inspecting existence of the open bubble 14*a* contacting the edge side 10*c* of the glass film 10 among the bubbles 14 existing in the interface 13 of the glass film 10 and the support glass 12.

According to the configuration, the glass film laminate 1 in which the open bubble 14*a* can be eliminated, whereby a yield of the glass film 10 can be improved.

In the method for manufacturing the glass film laminate 1 according to the present invention, it may be configured that existence of not only the open bubble 14*a* in the peripheral part 1*d* but also the close bubble 14*b* in the peripheral part 1*d* is inspected in the open bubble inspection step (STEP-2).

The close bubble 14*b* does not contact the edge side 10*c* of the glass film 10 and has a possibility to move to a position contacting the edge side 10*c* by change with time or external force at the time of the inspection, and has a possibility to change to the open bubble 14*a* after the inspection.

Figure 11:
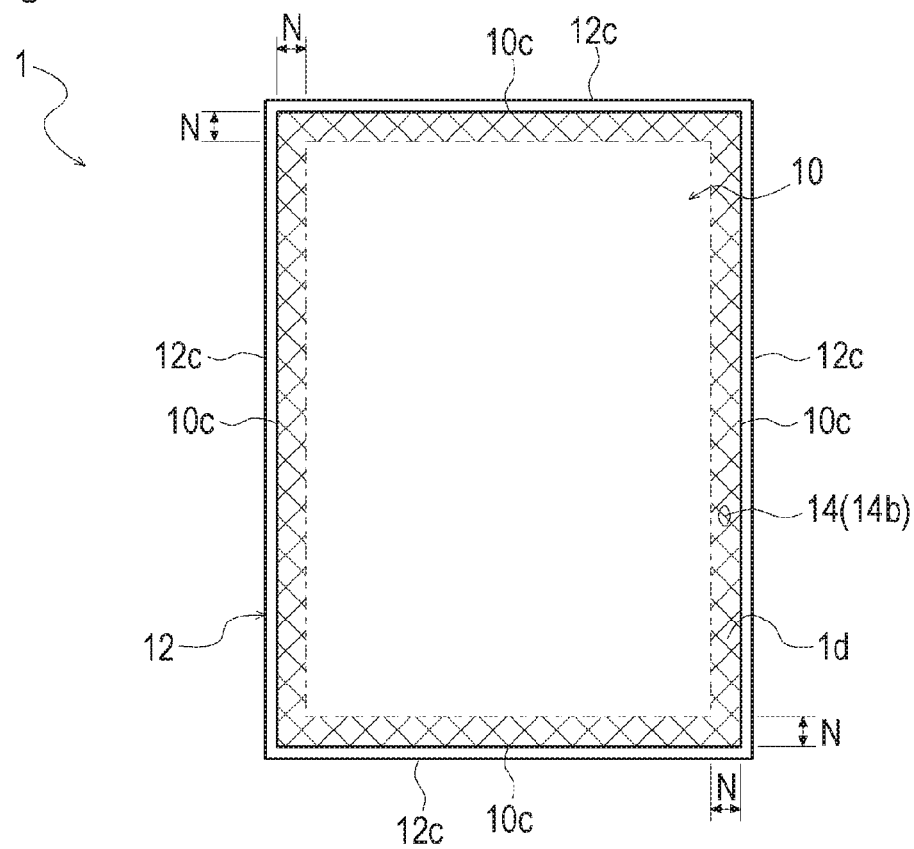
FIG. 11 is a schematic plan view of the glass film laminate (in the state in which a close bubble exists in a peripheral part).

Accordingly, in the method for manufacturing the glass film laminate 1 according to the present invention, in (STEP-2), the glass film laminate 1 in which the close bubble 14*b* exists in the peripheral part 1*d* as shown in FIG. 11 is eliminated as a defective product.

Figure 12:
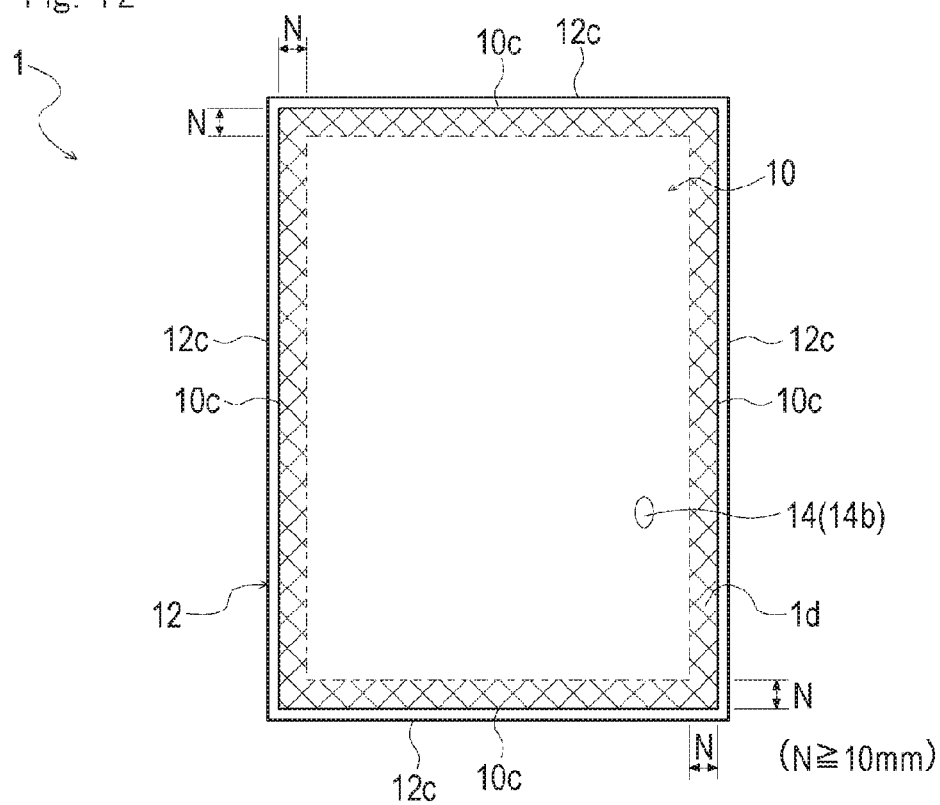
FIG. 12 is a schematic plan view of the glass film laminate according to the present invention (in the state in which a close bubble exists at an inner side from a peripheral part).

On the other hand, in the open bubble inspection step (STEP-2), the glass film laminate 1 in which the bubble 14 (the close bubble 14*b*) exists at an inner side from the peripheral part 1*d* as shown in FIG. 12 is treated as a non-defective product.

The glass film laminate 1 which is judged to be a defective product in the open bubble inspection step (STEP-2) is separated into the glass film 10 and the support glass 12 and returned to the first step so as to be reused.

Figure 13:
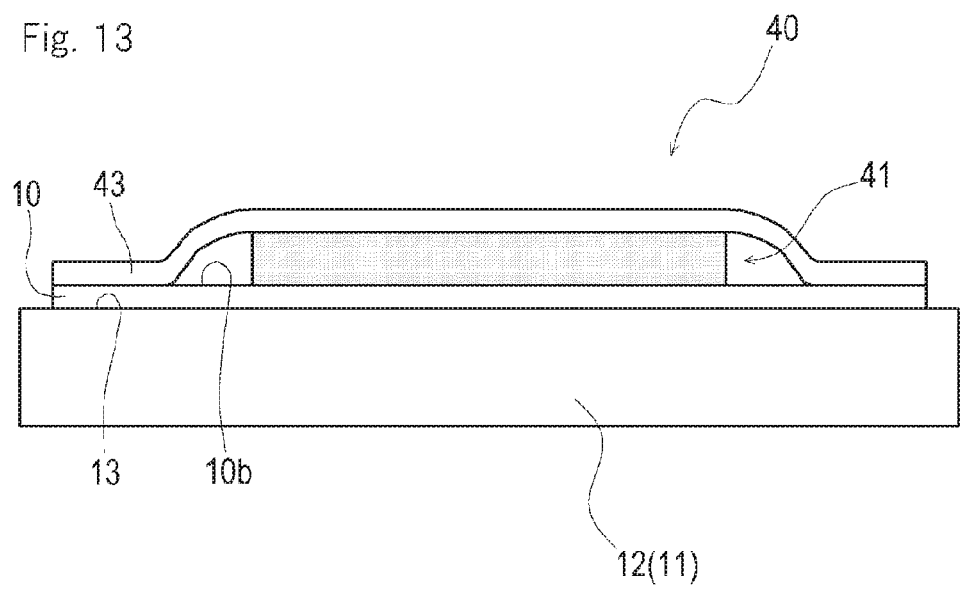
FIG. 13 is a schematic drawing of an electronic device with support glass which is an embodiment of the glass film laminate according to the present invention.

In a third step shown in FIG. 1, the manufacturing relevant process of an electronic device is performed. FIG. 13 is a drawing of an electronic device 40 with support glass. An element 41 such as liquid crystal, organic EL or a solar cell is formed on the glass film 10 of the glass film laminate 1. As shown in FIG. 1, in the forming of the element 41, for protecting partially the element 41, resist liquid 42 is applied to the glass film laminate 1. The resist liquid 42 is solidified by a method such as photosensitizing, drying or heating.

Figure 14:
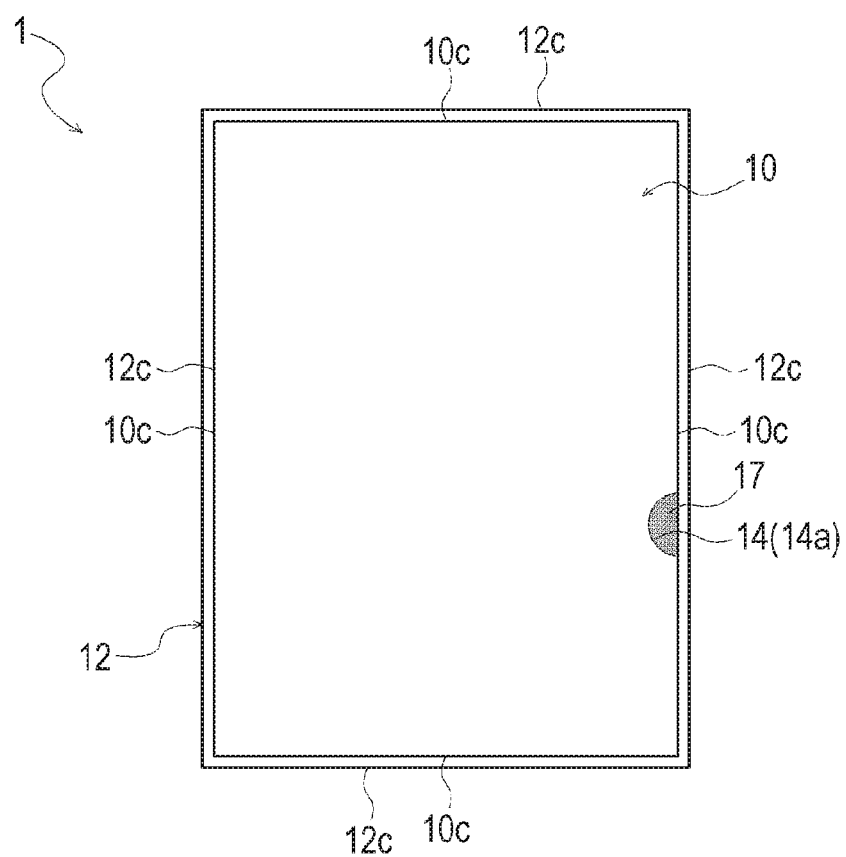
FIG. 14 is a schematic plan view of penetration status of resist liquid to an open bubble in the glass film laminate.

At this time, if the open bubble 14*a* exists in the interface 13 of the glass film laminate 1 as shown in FIG. 14, the resist liquid 42 penetrates the open bubble 14*a* and then solidified by the method such as photosensitizing or drying, whereby the glass film 10 and the support glass 12 are made adhere each other. Accordingly, in the open bubble inspection step (STEP-2), the glass film laminate 1 having the open bubble 14*a* is eliminated as a defective product.

The element 41 is closed by cover glass 43, and if the device is a liquid crystal panel, liquid crystal is injected (not shown), whereby the electronic device 40 with the support glass is formed.

Though the cover glass 43 and the glass film 10 are made adhere directly each other in the mode shown in FIG. 13, the cover glass 43 and the glass film 10 may be made adhere suitably via glass frit, a spacer or the like.

As a closing substrate closing the element 41, the cover glass 43 made by silicate glass and silica glass, borosilicate or non-alkali glass similarly to the glass film 10 is used.

As the cover glass 43, preferably, glass with a coefficient of linear thermal expansion whose difference with the glass film 10 at 30 to 380° C. is within $5\times10^{-7}/°$ C.

Accordingly, when temperature of a surrounding environment of a produced electronic device 50 is changed, warp by heat and breakage of the glass film 10 and the cover glass 43 caused by the difference of the coefficient of linear thermal expansion hardly occur, whereby the electronic device 50 is hard to be damaged.

For suppressing the difference of the coefficient of linear thermal expansion, the most preferably, glass of the same composition is used for both the cover glass 43 and the glass film 10.

A thickness of the cover glass 43 is preferably not more than 300 μm, more preferably 5 to 200 μm, and the most preferably 5 to 100 μm. Accordingly, the cover glass 43 can be made thinner so as to obtain suitably flexibility. When the thickness of the cover glass 43 is less than 5 strength of the cover glass 43 is needy.

Next, in a fourth step, in the electronic device 40 with the support glass, the glass film 10 is exfoliated from the support glass 12, whereby the electronic device 50 which is the glass film 10 in which the element 41 is formed is produced.

As shown in FIG. 1, in the fourth step according to the present invention, the electronic device 40 with the support glass is separated into the electronic device 50 (the glass film 10) and the support glass 12.

When the electronic device 50 is exfoliated from the support glass 12, an edge of the glass film 10 is pulled so as to be separated from the support glass 12 while a wedge (not shown) is inserted into the interface 13 of the glass film 10 and the support glass 12, whereby the electronic device 50 (the glass film 10) is exfoliated.

Supposing, in the glass film laminate 1 in which the glass film 10 and the support glass 12 are made adhere each other as shown in FIG. 14, at the time of exfoliating the glass film 10 from the support glass 12, stress is concentrated to an adhesion part by the resist liquid 42, whereby there is a high possibility that the glass film 10 is damaged with the adhesion part as a starting point.

On the other hand, in the mode in which generation of the open bubble 14a at the peripheral part 1d is prevented as the glass film laminate 1 according to the present invention (see FIGS. 8 and 12), since the resist liquid 42 does not penetrate the interface 13 so that adhesion of the glass film 10 and the support glass 12 caused by the solidified resist liquid 42 does not occur, whereby the glass film 10 is not damaged at the time of exfoliation.

As shown in FIG. 1, the support glass 12 (the support body 11) exfoliated in the fourth step can be returned to the first step so as to be reused for producing the glass film laminate 1.

According to the configuration of suppressing damage of the glass film 10 as the method for manufacturing the glass film laminate 1 according to the present invention, a reuse rate of the support glass 12 can be improved, thereby reducing a cost of the glass film laminate 1.

As explained above, the method for manufacturing the glass film laminate 1 according to the present invention is the method for manufacturing the glass film laminate 1 which is produced by laminating the glass film 10 and the support glass 12, and includes the ultrasonic wave application step (STEP-1-1) in which the ultrasonic wave US is applied to at least the peripheral parts 10d and 12d of the glass film 10 and the support glass 12, the washing step (STEP-1-2) in which the glass film 10 and the support glass 12 passing through the ultrasonic wave application step (STEP-1-1) are washed, and the laminating step (STEP-1-3) in which the glass film 10 and the support glass 12 passing through the washing step (STEP-1-2) are laminated so as to produce the glass film laminate 1.

According to the configuration, generation of the open bubble 14a in the peripheral part 1d of the glass film laminate 1 can be prevented.

Accordingly, penetration of the resist liquid 42 to the interface 13 of the glass film 10 and the support glass 12 in the resist step (third step) can be prevented, and as a result, adhesion of the glass film 10 and the support glass 12 can be prevented, thereby preventing damage of the glass film 10 at the time of exfoliation.

Next, results of an experiment confirming effect the method for manufacturing the glass film laminate 1 according to the present invention are explained.

In this experiment, a thin plate glass made by Nippon Electric Glass Company, Limited (product name: OA-10G) is used. A plate glass of 350 mm×450 mm×0.2 mm is used as the glass film, and a plate glass of 360 mm×460 mm×0.5 mm is used as the support glass. Using the glass film and the support glass of the above specifications, the 100 glass film laminates are produced respectively concerning total four kinds including the glass film laminates 1 according to examples 1 to 3 and the glass film laminate 1 according to a comparative example 1 intermingled at an optional rate.

Washing of the contact surfaces 10a and 12a are performed by rubbing the glass film 10 and the support glass 12 with sponge made from urethane while applying washing liquid to which alkaline detergent is added.

The ultrasonic wave (frequency 25 kHz) is applied to only the peripheral parts 10d and 12d of the glass film 10 and the support glass 12 for 30 seconds by the horn-type ultrasonic wave generator (tip area 20×80 mm), and then the contact surfaces 10a and 12a are washed and subsequently laminated directly, whereby the glass film laminate 1 according to the example 1 is produced.

Quality judging of the glass film laminate 1 according to the example 1 is performed only by the number of the bubbles 14 in the interface 13.

In the inspection by the number of the bubbles 14 in the interface 13, the product in which the number of the bubbles 14 is not more than $100/m^2$ is judged to be a non-defective product (the same applies to the following).

The ultrasonic wave (frequency 25 kHz) is applied to contact surfaces 10a and 12a (whole surfaces) of the glass film 10 and the support glass 12 for 30 seconds by the horn-type ultrasonic wave generator (the same as the above), and then the contact surfaces 10a and 12a are washed and subsequently laminated directly, whereby the glass film laminate 1 according to the example 2 is produced.

Quality judging of the glass film laminate 1 according to the example 2 is performed only by the number of the bubbles 14 in the interface 13.

The ultrasonic wave (frequency 25 kHz) is applied to the contact surfaces 10a and 12a (whole surfaces) of the glass film 10 and the support glass 12 for 30 seconds by the horn-type ultrasonic wave generator (the same as the above), and then the contact surfaces 10a and 12a are washed and subsequently laminated directly, whereby the glass film laminate 1 according to the example 3 is produced.

Quality judging of the glass film laminate 1 according to the example 3 is performed firstly by counting the number of the bubbles 14 in the interface 13, and the quality judging is performed further by inspecting existence of the open bubble 14a and the close bubble 14b in the peripheral part 1d (L=10 mm).

On the other hand, the glass film laminate 1 according to the comparative example 1 is produced by washing of the contact surfaces 10a and 12a and subsequent direct lamination without application of the ultrasonic.

Quality judging of the glass film laminate 1 according to the comparative example 1 is performed only by the number of the bubbles 14 in the interface 13.

FIG. 15 shows results of difference of the non-defective rate of the panels as final products in the case in which the quality judging is performed concerning the glass film laminates 1 according to the examples 1 to 3 and the comparative example 1 as the above.

In the case of the glass film laminate 1 according to the example 1, as a result of the judgement only by existence of the bubbles 14 in the interface 13, one defective product exists in the final panels and a final panel non-defective rate is 99%.

In the case of the glass film laminate 1 according to the example 2, as a result of the judgement only by existence of the bubbles 14 in the interface 13, two defective products exist in the final panels and the final panel non-defective rate is 98%.

In the case of the glass film laminate 1 according to the example 3, as a result of the judgement by existence of the bubbles 14 in the interface 13 and existence of the open bubble 14a and the close bubble 14b in the peripheral part 1d, no defective product exists in the final panels and a final panel non-defective rate is 100%.

On the other hand, in the case of the glass film laminate 1 according to the comparative example 1, as a result of the judgement only by existence of the bubbles 14 in the interface 13, ten defective products exist in the final panels and the final panel non-defective rate is 89%.

According to the results of the experiment shown in FIG. 15, in comparison with the case of not applying the ultrasonic wave US (that is, the case of the comparative example 1), by applying the ultrasonic wave US to the glass film 10 and the support glass 12, washing them and then producing the glass film laminate 1 as the glass film laminates 1 according to the examples 1 to 3, more number of the non-defective products of the final panels can be obtained.

According to the results of the experiment, as the glass film laminate 1 according to the example 3, by confirming that the open bubble 14a and the close bubble 14b do not exist in the peripheral part 1d, a yield of the final product can be improved further.

DESCRIPTION OF NOTATIONS

1 glass film laminate
1d peripheral part
10 glass film
10c edge side
10d peripheral part
12 support glass
12d peripheral part
14 bubble
14a open bubble
14b close bubble
30 horn-type ultrasonic wave generator
31 liquid
32 tub (ultrasonic wave washing tub)

The invention claimed is:

1. A glass film laminate produced by laminating directly a glass film and a support glass, characterized in that
all edge sides of the glass film contact the support glass without clearance,
wherein the glass film contacts the support glass without clearance with a width not less than 10 mm from all the edge sides of the glass film,
wherein a number of bubbles in a part of the glass film laminate except for the part in which the glass film contacts the support glass without clearance is not less than $0.1/m^2$ and not more than $10000/m^2$.

2. The glass film laminate according to claim 1, wherein a film layer is provided in the support glass.

3. A method for manufacturing a glass film laminate according to claim 1 produced by laminating a glass film on a support body, comprising:
an ultrasonic wave application step in which an ultrasonic wave is applied to at least peripheral parts of the glass film and the support body;
a washing step in which the glass film and the support body passing through the ultrasonic wave application step are washed; and
a laminating step in which the glass film and the support body passing through the washing step are laminated so as to produce the glass film laminate.

4. The method for manufacturing the glass film laminate according to claim 3 wherein the support body is support glass.

5. The method for manufacturing the glass film laminate according to claim 4, further comprising:
an ultrasonic wave washing step in which the glass film and the support glass are dipped in liquid in an ultrasonic wave washing tub and the whole of the glass film and the support glass are ultrasonic-washed by the ultrasonic wave washing tub.

6. The method for manufacturing the glass film laminate according to claim 4, further comprising:
an open bubble inspection step inspecting existence of an open bubble which is a bubble existing in an interface of the glass film and the support glass and contacting an edge side of the glass film.

7. The method for manufacturing the glass film laminate according to claim 6, wherein in the open bubble inspection step, existence of a bubble except for the open bubble in a peripheral part of the glass film laminate corresponding to the peripheral part of the glass film is inspected further.

8. The method for manufacturing the glass film laminate according to claim 7, wherein the peripheral part of the glass film laminate is within a width of not less than 10 mm from the edge side of the glass film.

9. The method for manufacturing the glass film laminate according to claim 8, wherein a number of bubbles in the glass film laminate except for the peripheral part is not less than $0.1/m^2$ and not more than $10000/m^2$.

10. The method for manufacturing the glass film laminate according to claim 7, wherein a number of bubbles in the glass film laminate except for the peripheral part is not less than $0.1/m^2$ and not more than $10000/m^2$.

11. The method for manufacturing the glass film laminate according to claim 4, wherein in the ultrasonic wave application step, the ultrasonic wave is applied by a horn-type ultrasonic wave generator.

12. The method for manufacturing the glass film laminate according to claim 3, wherein in the ultrasonic wave application step, the ultrasonic wave is applied by a horn-type ultrasonic wave generator.

13. The method for manufacturing the glass film laminate according to claim 12, wherein in the ultrasonic wave application step, the ultrasonic wave is applied to only the peripheral parts of the glass film and the support glass.

14. The method for manufacturing the glass film laminate according to claim 3, further comprising:
   an ultrasonic wave washing step in which the glass film and the support body are dipped in liquid in an ultrasonic wave washing tub and the whole of the glass film and the support body are ultrasonic-washed by the ultrasonic wave washing tub.

15. The method for manufacturing the glass film laminate according to claim 3, further comprising:
   an open bubble inspection step inspecting existence of an open bubble which is a bubble existing in an interface of the glass film and the support body and contacting an edge side of the glass film.

16. The method for manufacturing the glass film laminate according to claim 15, wherein in the open bubble inspection step, existence of a bubble except for the open bubble in a peripheral part of the glass film laminate corresponding to the peripheral part of the glass film is inspected further.

17. The method for manufacturing the glass film laminate according to claim 16, wherein the peripheral part of the glass film laminate is within a width of not less than 10 mm from the edge side of the glass film.

18. The method for manufacturing the glass film laminate according to claim 17, wherein a number of bubbles in the glass film laminate except for the peripheral part is not less than $0.1/m^2$ and not more than $10000/m^2$.

19. The method for manufacturing the glass film laminate according to claim 16, wherein a number of bubbles in the glass film laminate except for the peripheral part is not less than $0.1/m^2$ and not more than $10000/m^2$.

20. A method for manufacturing an electronic device comprising:
   a laminating step in which a glass film is laminated on a support body so as to produce the glass film laminate before a manufacturing relevant process of the electronic device;
   a step in which the manufacturing relevant process of the electronic device is performed to the glass film of the glass film laminate so as to form an element on the glass film of the glass film laminate and the element is closed by a closing substrate, thereby producing the electronic device with the support body; and
   a step in which the glass film of the electronic device with the support body after the manufacturing relevant process of the electronic device is exfoliated from the support body so as to manufacture the electronic device,
   characterized in that
   in the laminating step, the glass film laminate is produced by the method for manufacturing the glass film laminate according to claim 3.

21. A method for manufacturing an electronic device comprising:
   a laminating step in which a glass film is laminated on a support body so as to produce the glass film laminate before a manufacturing relevant process of the electronic device;
   a step in which the manufacturing relevant process of the electronic device is performed to the glass film of the glass film laminate so as to form an element on the glass film of the glass film laminate and the element is closed by a closing substrate, thereby producing the electronic device with the support body; and
   a step in which the glass film of the electronic device with the support body after the manufacturing relevant process of the electronic device is exfoliated from the support body so as to manufacture the electronic device,
   characterized in that
   in the laminating step, the glass film laminate is produced by the method for manufacturing the glass film laminate according to claim 4.

* * * * *